United States Patent
Tzeng et al.

(10) Patent No.: US 6,638,813 B1
(45) Date of Patent: Oct. 28, 2003

(54) METHOD OF FORMING A COMPOSITE SPACER TO ELIMINATE POLYSILICON STRINGERS BETWEEN ELEMENTS IN A PSEUDO SRAM CELL

(75) Inventors: Kuo-Chyuan Tzeng, Hsin-Chu (TW); Chen-Jong Wang, Hsin-Chu (TW); Chung-Wei Chang, Hsin-Chu (TW); Wen-Chuan Chiang, Hsin-Chu (TW); Wen-Cheng Chen, Chinglin Shiang (TW); Kuo-Ching Huang, Kaohsiung (CH)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 89 days.

(21) Appl. No.: 10/059,825

(22) Filed: Jan. 29, 2002

(51) Int. Cl.⁷ .......................................... H01L 21/8242
(52) U.S. Cl. ..................................................... 438/244
(58) Field of Search ................. 438/210, 229, 438/230, 239, 243, 244, 396

(56) References Cited

U.S. PATENT DOCUMENTS 5,744,853 A    4/1998   Quek et al. ................. 257/532
5,976,928 A   11/1999   Kirlin et al. ................. 438/240
5,999,474 A   12/1999   Leung et al. ................ 365/222
6,028,804 A    2/2000   Leung .......................... 365/222

*Primary Examiner*—Evan Pert
(74) *Attorney, Agent, or Firm*—George O. Saile; Stephen B. Ackerman

(57) ABSTRACT

A process for forming a composite insulator spacer on the sides of a buried stack capacitor structure, wherein the buried stack capacitor structure is located overlying a portion of an insulator filled, shallow trench isolation (STI) region, has been developed. A thin silicon nitride spacer is first formed on the sides of the completed buried stack capacitor structure, followed by deposition of a silicon oxide layer. An anisotropic dry etch procedure is next employed removing a top portion of the silicon oxide layer, and resulting in a partially defined silicon oxide spacer. A critical wet etch procedure is next used to remove the bottom portion of the silicon oxide layer, defining the final silicon oxide spacer of the composite insulator spacer, now comprised of a silicon oxide spacer on an underlying silicon nitride spacer. The wet etch procedure allows a gradual slope to be created at the composite insulator spacer—STI region interface, reducing the risk of leaving, or forming polysilicon residuals or stringers on the underlying surface, which can occur during definition of a MOSFET gate structure. The elimination of the polysilicon stringers reduces the risk of leakage between SRAM cell elements, such as buried stack capacitor structures, and MOSFET devices.

30 Claims, 9 Drawing Sheets

METHOD OF FORMING A COMPOSITE SPACER TO ELIMINATE POLYSILICON STRINGERS BETWEEN ELEMENTS IN A PSEUDO SRAM CELL

BACKGROUND OF THE INVENTION (1) Field of the Invention

The present invention relates to methods used to fabricate semiconductor devices, and more specifically to a method used to eliminate polysilicon residual material located between buried stack capacitor and other elements of a static random access memory (SRAM) cell.

(2) Description of Prior Art

The advent of micro-miniaturization, or the ability to fabricate semiconductor devices comprised with sub-micron features, have allowed the performance of memory cells comprised with sub-micron devices to be improved, while still resulting in a reduction of the fabrication cost for the specific semiconductor chip comprised with sub-micron devices. The use of sub-micron features allow performance degrading parasitic junction capacitances to be reduced. In addition the use of sub-micron features also allow a greater number of smaller semiconductor chips to be obtained from a specific size starting substrate, thus reducing the cost of a specific semiconductor chip. The semiconductor chips comprised with devices formed with sub-micron features, still provide device densities equal to, or greater than counterpart semiconductor chips comprised with devices formed with larger features. To further decrease the size of semiconductor chips specific designs for such cells such as SRAMs, have to considered. SRAM designs comprised with six devices, four N channel, metal oxide semiconductor field effect transistors (MOSFET) devices, and two P channel MOSFET devices, limit the ability to reduce semiconductor chip size, therefore new SRAM cell designs such as a pseudo SRAM or a one transistor SRAM (1T SRAM), have been used to minimize semiconductor chip size.

The use of pseudo or 1T SRAM designs entail the use of only a capacitor structure along with only a MOSFET device, to satisfy the requirements of these new SRAM cell designs. To further minimize cell area a buried stack capacitor structure, formed in a shallow trench isolation (STI) region, is used to satisfy the capacitance requirements of the pseudo or 1T SRAM cells. The buried stack capacitor structure provides the needed cell capacitance without consuming the additional semiconductor area, or process complexity encountered with counterpart capacitor structures such as stacked capacitor, or trench capacitance structures. However is imperative during the fabrication of pseudo or 1T SRAM cells, to eliminate leakage or shorting paths between the buried capacitor structure and an adjacent MOSFET device such as a pass gate transistor. The fabrication of the polysilicon gate structure of the MOSFET device, accomplished after completion of the buried stack capacitor structure, can result in residual polysilicon, or polysilicon stringers located between these elements. The process conditions encountered by the STI region, used to accommodate the buried stack capacitor structure, can result in surface topographies which can prove to be conducive to formation of undesirable polysilicon residuals or stringers.

This invention will describe a novel process sequence allowing a composite spacer to be formed on the sides of a buried stack capacitor structure, which in turn allow a smoother, final STI surface to result, thus reducing the risk of polysilicon residuals or stringers forming during the subsequent definition of a MOSFET polysilicon gate structure. Prior art such as Kirlin et al, in U.S. Pat. No. 5,976,928, as well as Quek et al, in U.S. Pat . No. 5,744,853, describe processes for forming capacitor structures for memory cells, however these prior arts do not employ the unique process sequence described in this present invention in which a composite insulator layer is formed on the sides of a completed buried stack capacitor structure prior to definition of a gate structure of an adjacent MOSFET device, resulting in STI topographies less conducive to allowing formation of overlying polysilicon residual or stringers than counterparts formed without the composite spacer.

SUMMARY OF THE INVENTION

It is an object of this invention to fabricate a pseudo SRAM or a 1T SRAM cell, comprised with a buried stack capacitor structure formed in shallow trench isolation (STI) region, and comprised with an adjacent MOSFET device.

It is another object of fabricate the MOSFET device of the SRAM cell after formation of the buried stack capacitor structure.

It is still another object of this invention to form a composite insulator spacer on the sides of the buried stack capacitor structure, prior to formation of a polysilicon gate structure of the adjacent MOSFET device.

It is still yet another object of this invention to subject the composite insulator spacer to a wet etch procedure to obtain a smooth top surface topography comprised of the partially etched composite spacer and the wet etch treated STI region, allowing subsequent definition of the MOSFET polysilicon gate structure to be accomplished without leaving polysilicon residuals or stringers on the surface located between the MOSFET and buried capacitor elements.

In accordance with the present invention a process for forming a smooth surface topography, and a gradual slope, between a buried stack capacitor structure located in and on an STI region, and an adjacent MOSFET device, via formation of, and wet etch treatment of a composite insulator spacer formed on the sides of a completed buried stack capacitor structure prior to formation of a MOSFET gate structure, is described. After formation of an STI region in a top portion of a semiconductor substrate, storage node structures are formed in recesses in the STI region. Completion of the buried stack capacitor structure comprising formation of a capacitor dielectric layer, and of an overlying capacitor top plate, results in a first portion of the non-recessed STI region now covered by the capacitor top plate, while a second portion of the non-recessed STI region remains uncovered. A composite insulator spacer comprised of an underlying silicon nitride component and an overlying silicon oxide component, is defined on the sides of the completed buried stack capacitor structure. The silicon oxide component of the composite insulator spacer is obtained via an anisotropic dry etch procedure followed by a wet etch procedure, with the wet etch procedure resulting in the final definition of the silicon oxide spacer as well presenting a gradual slope at the interface between the composite insulator spacer and the partially etched STI region. Subsequent formation of a gate structure for a MOSFET device located adjacent to the buried stack capacitor structure, is accomplished without polysilicon residual or stringer formation on the underlying smooth surface topography, or on the gradual slope presented by the underlying insulator material located between the buried stack capacitor structure and the adjacent MOSFET device.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming a smooth surface topography and a gradual slope, for insulator material located between a completed buried stack capacitor structure and a adjacent MOSFET device, to reduce the risk of polysilicon residuals or stringers forming between these elements on the underlying insulator material, during definition of the MOSFET gate structure, will now be described in detail. Semiconductor substrate 1, comprised of single crystalline silicon, featuring a <100> crystallographic orientation, is used and schematically shown in FIG. 1. N well region 2, needed to accommodate a subsequent P channel MOSFET device is formed in a top portion of semiconductor substrate 1, via implantation of arsenic or phosphorous ions at an energy between about 100 to 400 KeV, at a dose between about 1E12 to 5E13 atoms/cm$^2$. An anneal procedure performed at a temperature between about 1000 to 1050° C., is used to activate the N type ions in N well region 2. A composite insulator layer 3, comprised of an overlying layer of silicon nitride and an underlying layer of silicon dioxide is formed on the top surface of semiconductor substrate 1. Underlying silicon dioxide layer is obtained via thermal oxidation procedures at a thickness between about 100 to 150 Angstroms, while the overlying silicon nitride layer is obtained via low pressure chemical vapor deposition (LPCVD), or plasma enhanced vapor deposition (PECVD) procedures, at a thickness between about 500 to 1000 Angstroms.

Figure 1:
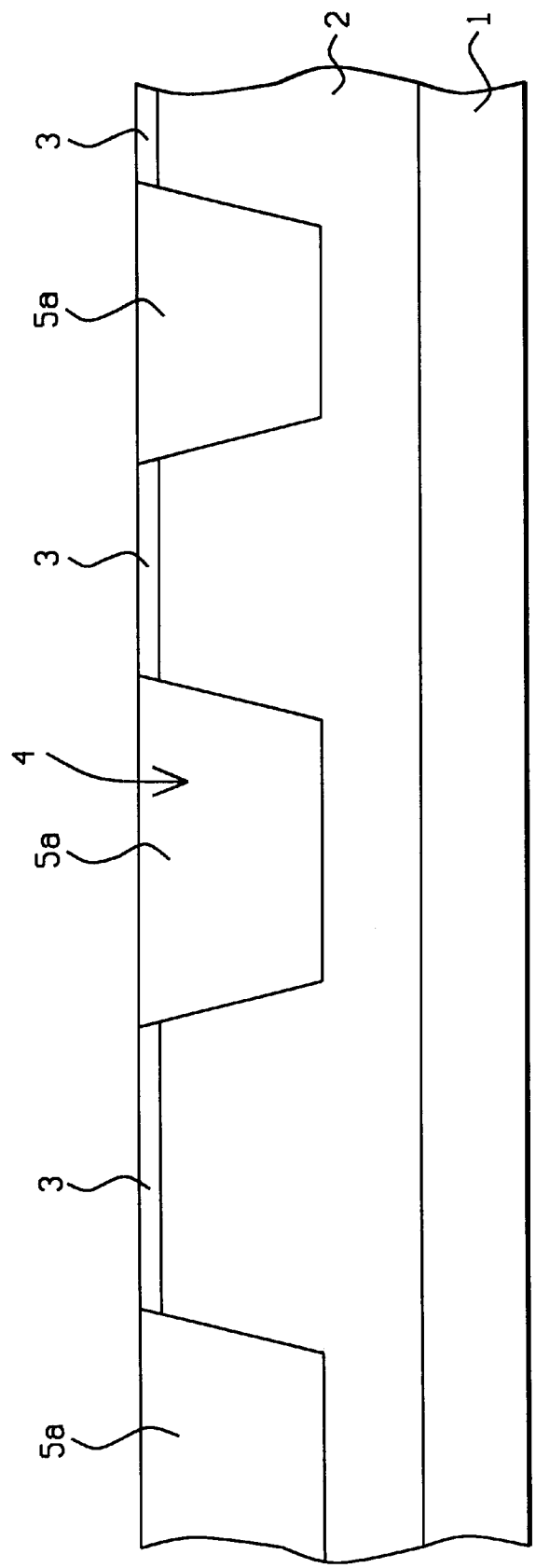
FIGS. 1–10, which schematically, in cross-sectional style, show key stages of fabrication used to form an SRAM cell comprised of a buried stack capacitor structure and a MOSFET device, featuring establishment of a smooth surface topography, and of a gradual slope for underlying insulator material located between these SRAM elements, established to reduce the risk of polysilicon residuals or stringers forming between these elements on the underlying insulator material during definition of the MOSFET gate structure.

A photoresist shape, not shown in the drawings, is used as a mask to allow a reactive ion etching (RIE) procedure to define an opening in composite insulator layer 3, and to define the shallow trench shape 4, in a top portion of semiconductor substrate 1, to a depth between about 3000 to 4000 Angstroms. This is accomplished using CHF$_3$ or CF$_4$ as an etchant for composite insulator 3, while using Cl$_2$ or SF$_6$ as an etchant for silicon. Shallow trench shape 4, located in the top portion of N well region 2, can be defined with tapered sides, at an angle between about 80 to 83°, as schematically shown in FIG. 1, via use of a RIE pressure between about 1.0 to 10 mtorr. Shallow trench shape can also be formed with straight sides, using a more anisotropic RIE procedure, at a decreased RIE pressure between about 1.0 to 10 mtorr. After removal of the shallow trench shape defining photoresist shape, via plasma oxygen ashing, a silicon oxide layer is deposited at a thickness between about 6000 to 8000 Angstroms, via LPCVD or PECVD procedures, using tetraethylorthosilicate (TEOS), as a source, completely filling shallow trench shapes 4. If desired a thermally grown, silicon dioxide layer can be used as a liner layer in shallow trench shape 4, prior to filling shallow trench shapes 4, with the silicon oxide layer. A chemical mechanical polishing (CMP) procedure is next used to remove portions of the silicon oxide layer from the top surface of the silicon nitride component of composite insulator layer 3, resulting in insulator filled, shallow trench isolation (STI) region 5a. The result of these procedures is schematically shown in FIG. 1.

Figure 2:
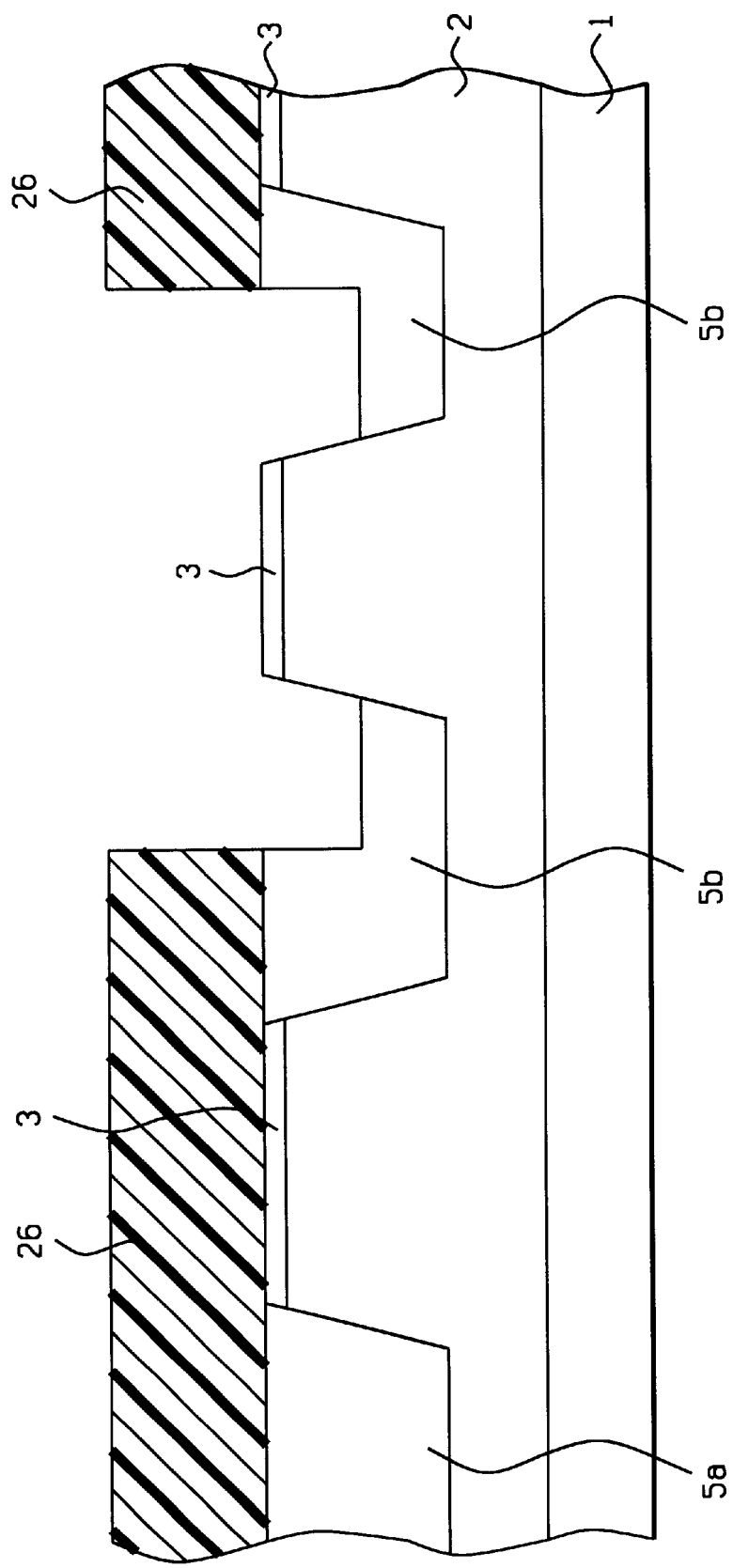

Photoresist shape 26, is next defined and used as a mask to allow top portions of STI regions 5a, to be removed. The selective, anisotropic RIE procedure, performed using CHF$_3$ as an etchant for silicon oxide, also removes exposed regions of silicon oxide located between STI regions, with the selective etch terminating at the appearance of the top surface of composite insulator layer 3. Removal of between about 1600 to 2000 Angstroms from STI regions, result in the formation of partially etched STI regions 5b, comprised of partially etched STI recesses, and of planar unetched portions STI surfaces, protected by photoresist shape 26, during the selective RIE procedure. The result of these procedures is schematically shown in FIG. 2.

Figure 3:
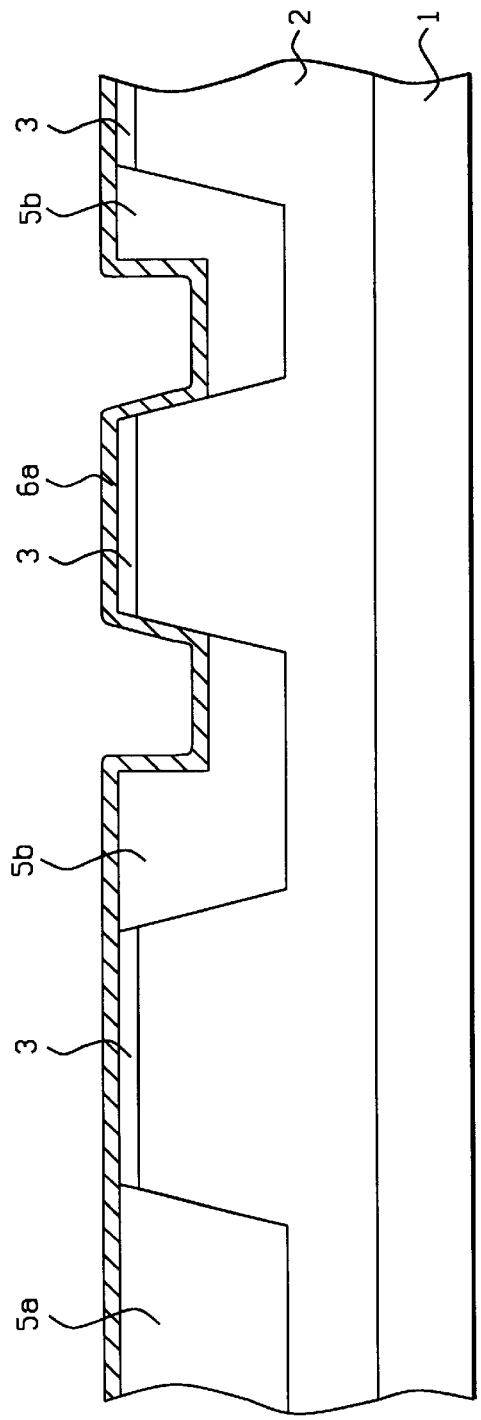

After removal of photoresist shape 26, via plasma oxygen ashing, polysilicon layer 6a, is deposited via LPCVD procedures at a thickness between about 250 to 350 Angstroms. Polysilicon layer 6a, conformally covers all surfaces of STI regions 5b, as well as overlying the planar top surface of composite insulator layer 3, located between STI regions 5b. Polysilicon layer 6a, shown schematically in FIG. 3, can be deposited intrinsically then doped via implantation of boron ions, or polysilicon layer 6a, can be doped in situ during deposition via the addition of diborane to a silane ambient.

Figure 4:
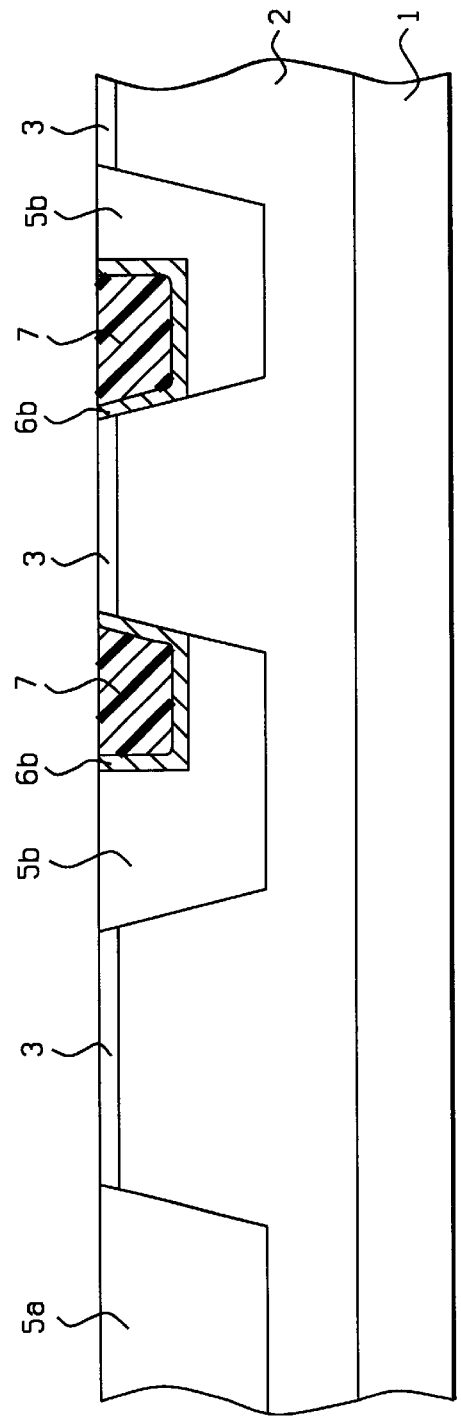

A planarizing photoresist layer is next applied, completely covering all features of the underlying structure. Etch back of photoresist layer is next selectively performed via a RIE procedure using oxygen as an etchant for photoresist. The oxygen RIE procedure is terminated at the appearance of the top surface of polysilicon layer 6a, in regions in which polysilicon layer 6a, resided on planar top surface STI regions 5b, and on the planar top surface of composite insulator layer 3. Portions of polysilicon layer 6a, residing in the STI recesses, or in the etched portions of STI regions 5b, are now covered by photoresist plugs 7. The formation of photoresist plugs 7, or the removal of photoresist from planar top surfaces, can also be accomplished via a CMP procedure. Another selective RIE procedure, using Cl$_2$ or SF$_6$ as an etchant for polysilicon, is then used to remove portions of polysilicon layer 6a, not protected by photoresist plugs 7, resulting in definition of polysilicon storage node structures 6b, located in STI regions 5b. This is schematically shown in FIG. 4. If desired definition of polysilicon storage node structure, or bottom plate 6b, can be accomplished via CMP procedures, selectively removing portions of polysilicon layer 6a, from the planar top surfaces of STI regions 5b, and from the planar top surface of composite insulator layer 3. After definition of polysilicon storage node structures 6b, photoresist plugs 7, are removed via plasma oxygen ashing.

Figure 5:
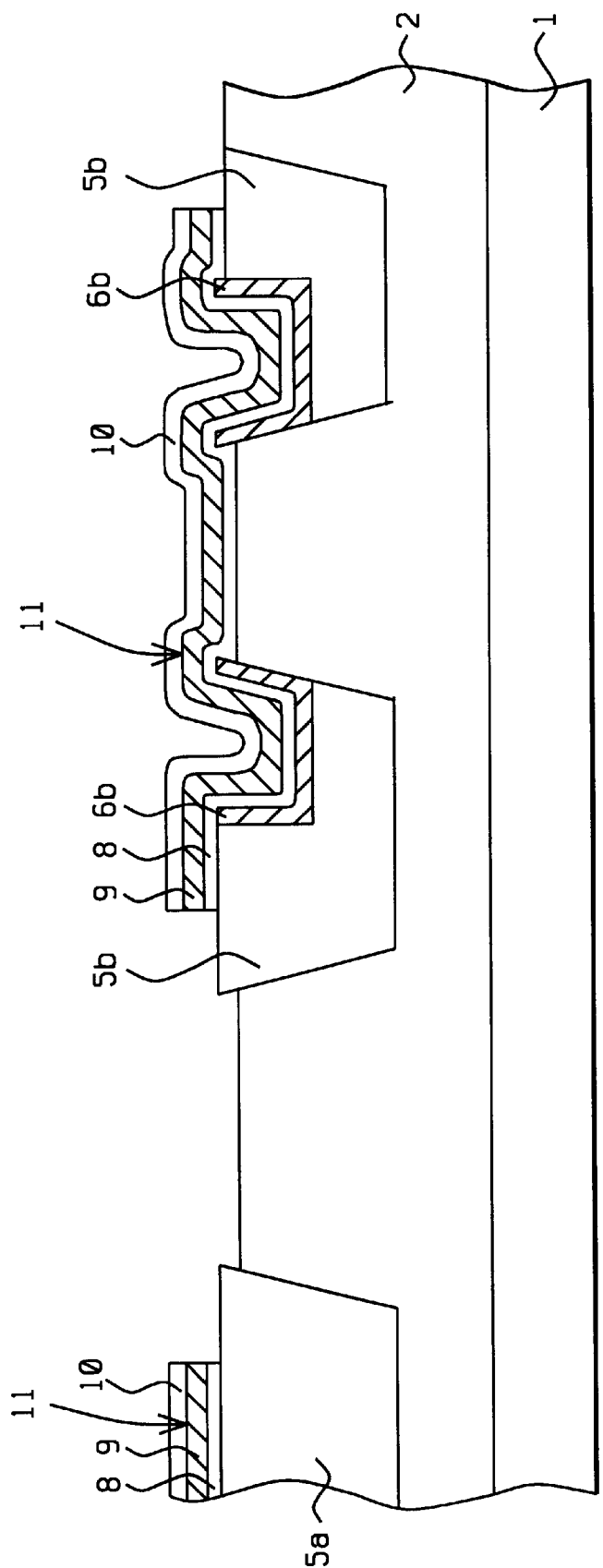

Composite insulator layer 3, is next removed using a hot phosphoric acid solution to selectively etch the silicon nitride component of composite insulator layer 3, followed by exposure of the silicon oxide component of the composite insulator layer to a buffered hydrofluoric (BHF), or to a dilute hydrofluoric (DHF) acid solution. The removal of composite insulator layer 3, results in the top surface STI regions 5b, now at a higher level than the top surface of STI regions 5b. This is schematically shown in FIG. 5. Capacitor dielectric layer 8, a material such as a oxidized silicon nitride (NO), layer, is next formed at a thickness between about 50 to 55 Angstroms. Capacitor dielectric layer 8, is formed via deposition of a silicon nitride layer, using LPCVD or PECVD procedures, followed by thermal oxidation of a top portion of the silicon nitride layer, performed in an oxygen—steam ambient, at a temperature between about 900 to 950° C. If desired the capacitor dielectric layer can be comprised of tantalum oxide, or oxidized silicon nitride on silicon oxide (ONO). Polysilicon layer 9, is then deposited via LPCVD procedures to a thickness between about 450 to 550 Angstroms, with the polysilicon layer either doped during deposition via the addition of diborane to a silane ambient, or with polysilicon layer 9, deposited intrinsically then doped via implantation of boron ions. Finally silicon oxynitride layer 10, is deposited via LPCVD or PECVD procedures, at a thickness between about 250 to 350 Angstroms. Conventional photolithographic and RIE procedures, using $CF_4$ as an etchant for silicon oxynitride and for capacitor dielectric layer 8, and using $Cl_2$ or $SF_6$ as an etchant for polysilicon, are then employed to define buried stack capacitor structure 11, schematically shown in FIG. 5. Buried stack capacitor structure 11, overlaid with silicon oxynitride shape 10, and comprised of polysilicon top plate structure 9, capacitor dielectric layer 8, and polysilicon storage node structure 6b, features polysilicon storage node structure 6b, located in the recessed portions of STI regions 5b, while the edges of polysilicon top plate structure 9, reside on the planar top surface of STI region 5b. This is schematically shown in FIG. 5.

Figure 6:
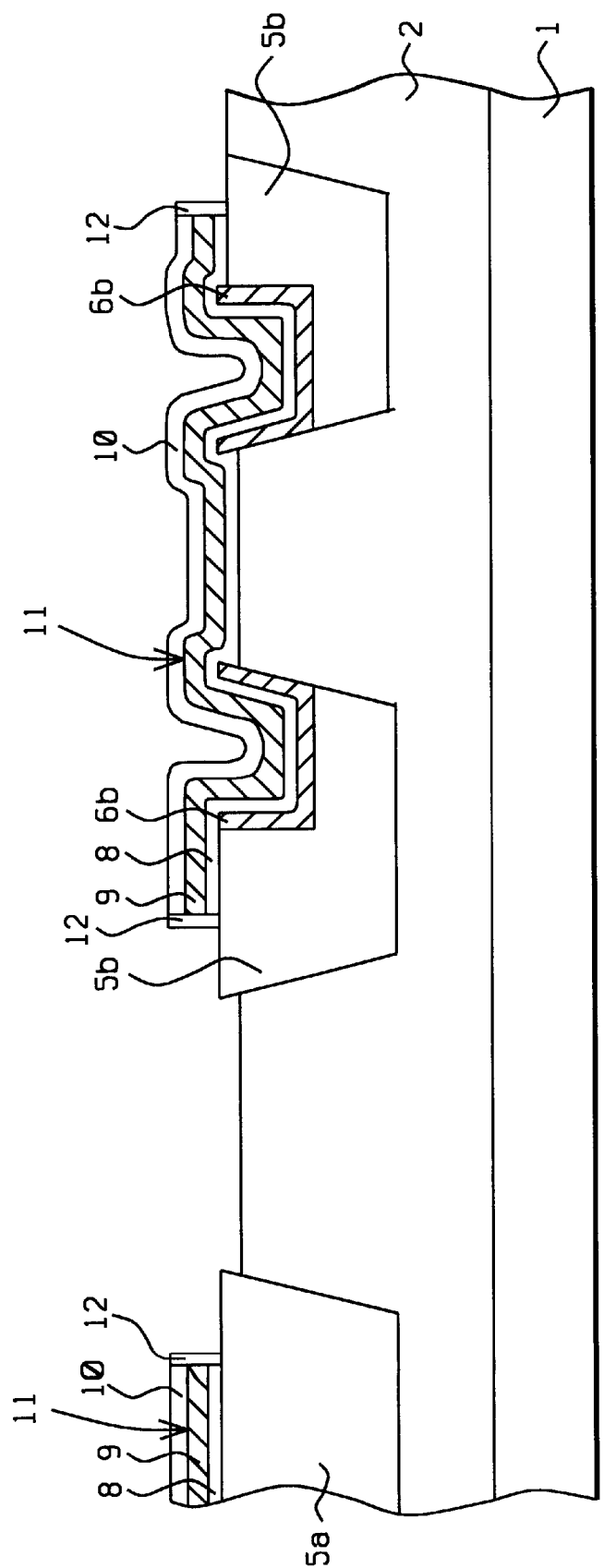
Figure 7:
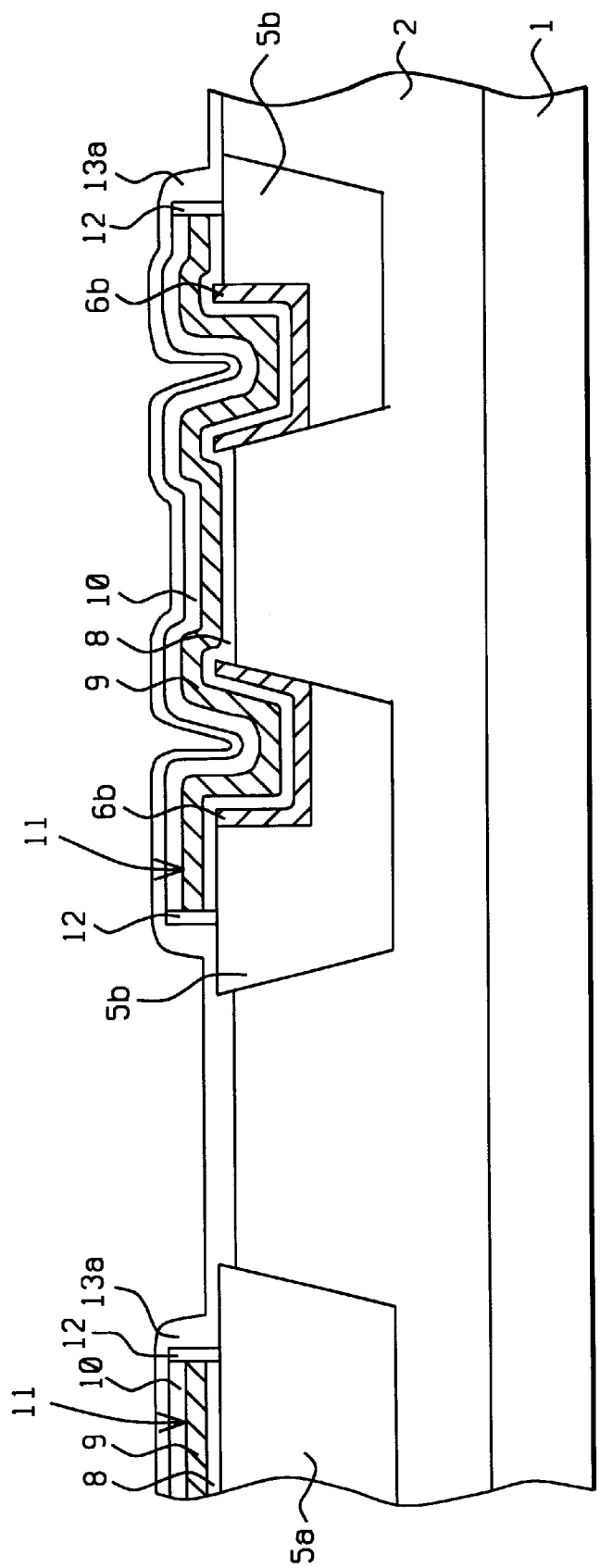
Figure 8:
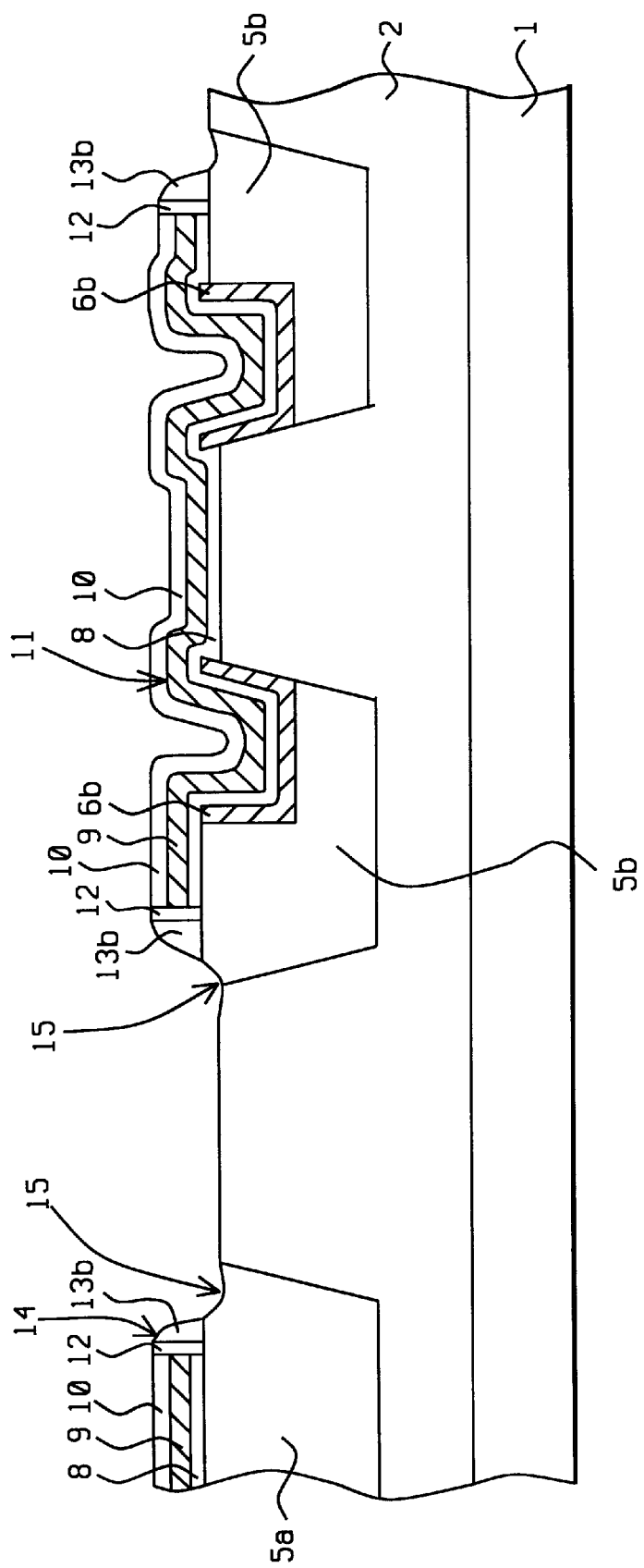

The formation of a composite insulator spacer on the sides of buried stack capacitor structure 11, and the process used to establish a smooth topography on the surface located between the composite insulator spacer and the buried stack capacitor structure is now addressed and schematically detailed in FIGS. 6–8. A silicon nitride layer is first deposited via LPCVD or PECVD procedures, at a thickness between about 200 to 300 Angstroms. An anisotropic RIE procedure, using $Cl_2$ or $CF_4$ as a selective etchant for silicon nitride, is performed resulting in silicon nitride spacers 12, located on the sides of buried stack capacitor structures 11. This is schematically shown in FIG. 6. A silicon oxide layer is next deposited via LPCVD or PECVD procedures, at a thickness between about 1000 to 1200 Angstroms, using TEOS as a source. Another anisotropic RIE procedure is performed, using $CHF_3$ as an etchant, to remove between about 800 to 900 Angstroms of silicon oxide, resulting in partially defined silicon oxide spacer 13a, schematically in FIG. 7. This dry etch procedure results in between about 200 to 400 Angstroms of the silicon oxide layer used for partially defined silicon oxide spacer, still remaining on the top surface of STI regions 5.

A critical wet etch procedure, using a buffered hydrofluoric (BHF), or a dilute hydrofluoric (DHF), solution as an etchant, is next employed to remove between about 200 to 400 Angstroms of exposed silicon oxide, resulting in the definition of final silicon oxide spacer 13b. The wet etch procedure also results in removal of the portions of STI regions 5b, with the STI regions nearest the edge of these regions exposed to the wet etch procedure for a longer period of time than the STI regions originally underlying partially defined silicon oxide spacers 13a, thus resulting in slope or taper 15. This is shown schematically in FIG. 8. The gradual profile presented by slope 15, established as a result of a greater degree of removal of silicon oxide at the STI edges than at the portion of STI originally underlying initial silicon oxide spacer 13a, in combination with the slope of final silicon oxide spacer 13b, results in a smooth surface topography, less conducive to retaining residual material from subsequent processing sequences. In addition the wet etch procedure used to establish slope 15, removed the raised top portion of STI regions 5b, which in turn was established as a result of removal of composite insulator layer 3. The removal of this top portion of STI regions 5b, also assists in establishing a smooth top surface needed to avoid residuals and stringers formed during subsequent process steps. Final composite spacer 14, comprised of final silicon oxide spacer 13b, and silicon nitride spacer 12, located adjacent to tapered region 15, of STI regions 5b, is schematically shown in FIG. 8.

Figure 9:
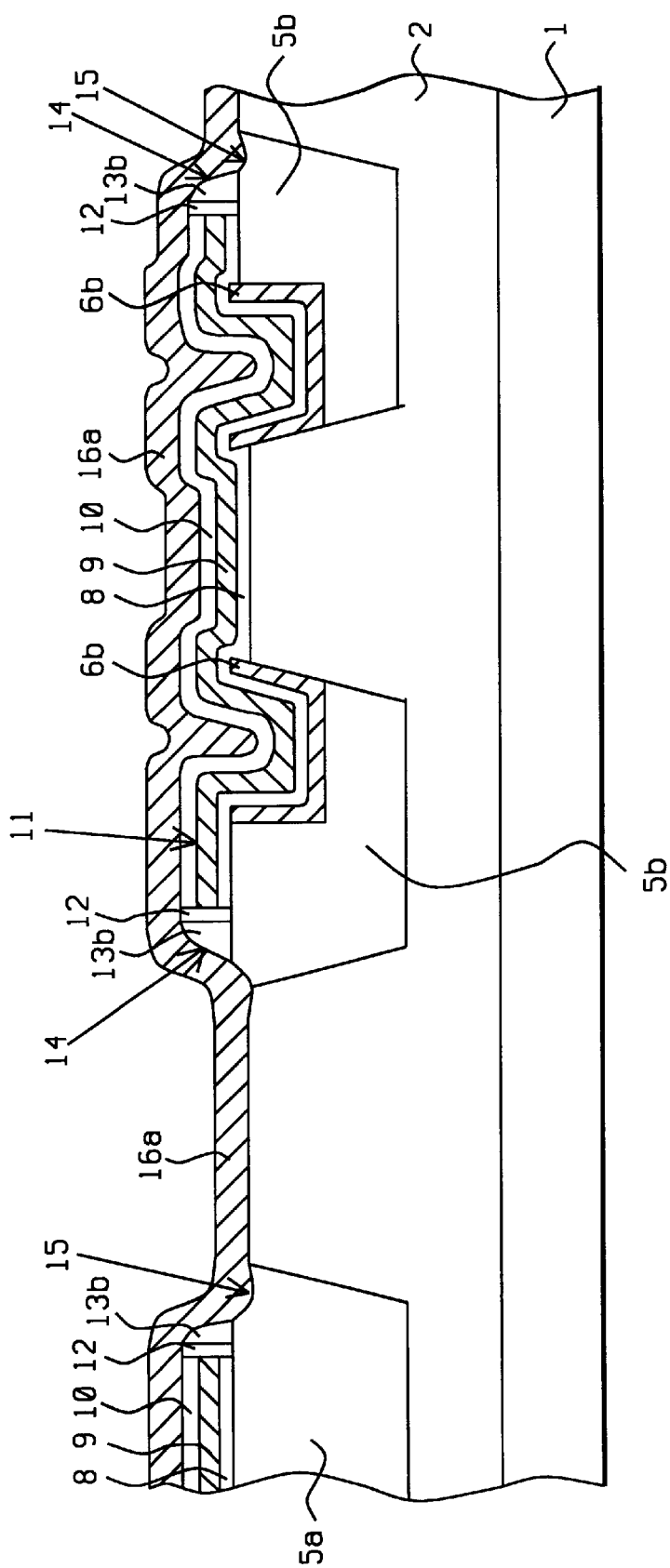
Figure 10:
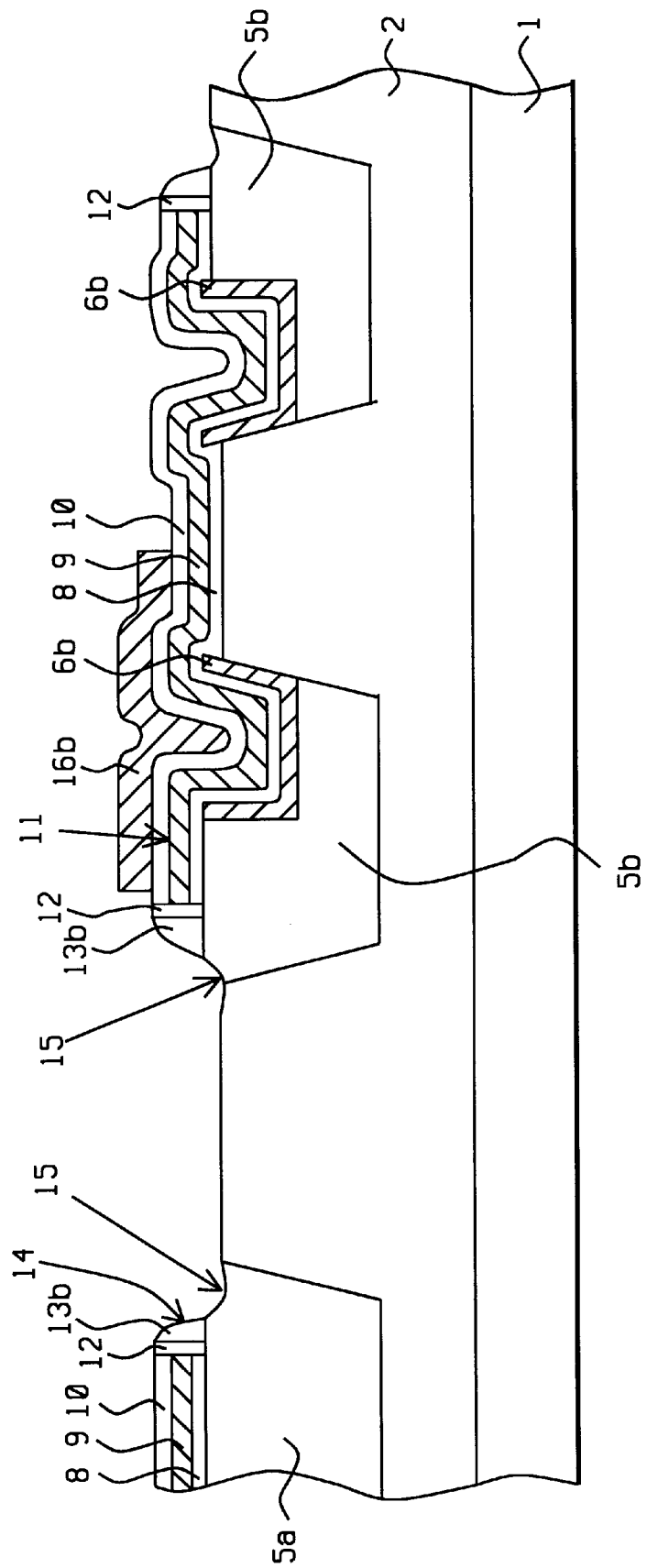

At this stage of fabrication of a pseudo or 1T SRAM cell, the formation of a MOSFET device, located adjacent to the completed buried stack capacitor structures will ensue. The entire fabrication procedure for the MOSFET device will not be described. Only the procedures in which the MOSFET gate structure is defined, procedures in which undesirable polysilicon residuals or stringers can form, will be described. After growth of the MOSFET gate insulator layer, (not shown in the drawings), polysilicon layer 16a, is deposited via LPCVD procedures, at a thickness between about 1600 to 2000 Angstroms. This is schematically shown in FIG. 9. A photoresist shape, (not shown in the drawings), is used as an etch mask to allow a selective RIE procedure, using $Cl_2$ as an etchant for polysilicon, to define interconnect polysilicon structure 16b, on buried stack capacitor structure 11, as well as to define a polysilicon gate structure, (not shown in the drawings), for a adjacent MOSFET device. This is shown schematically in FIG. 10. The significant point of this procedure is the absence of polysilicon residuals or stringers, located between buried stack capacitor structures, and between a buried stack capacitor structure and an adjacent MOSFET device. The absence of the unwanted polysilicon residuals or stringers is accomplished as a result of underlying insulator material comprised with a smooth topography, and gradual slope 15, allowing all regions of exposed polysilicon to be removed during definition of the MOSFET gate structure. Counterpart surfaces, established without the smooth topography or gradual slope 15, may be formed with undercuts or divots in the STI regions, resulting in difficulties in removing unwanted portions of polysilicon during definition of the MOSFET gate structure and of the buried stack capacitor polysilicon interconnect structure. This would result in unwanted leakage or shorts between these SRAM elements.

While this invention has been particularly shown and described with reference to the preferred embodiments thereof, it will be understood by those skilled in the art that various changes in form and details may be made without departing from the spirit and scope of this invention.

What is claimed is:

1. A method of forming buried stack capacitor structures on a semiconductor substrate, featuring a multiple etch procedure used for formation of composite insulator spacers on the sides of said buried stack capacitor structures, comprising the steps of:

forming silicon oxide filled, shallow trench isolation (STI) regions, in a top portion of said sericonductor substrate;

performing a first dry etch procedure to first form recesses in top portions of first sections of said STI regions, while second sections of said STI regions remain unetched;

forming storage node structures in said recesses located in said top portions of said first sections of said STI regions;

forming a capacitor dielectric layer on said storage node structures and on portions of said second sections of said STI regions;

forming capacitor top plate structures on said capacitor dielectric layer resulting in said buried stack capacitor structures, each comprised with a capacitor top plate structure, with a said capacitor dielectric layer, and with a storage node structure located in a recess in a top portion of a first section of said STI region;

forming silicon nitride spacers on the sides of said buried stack capacitor structures;

depositing a silicon oxide layer;

performing a second dry etch procedure to remove a top portion of said silicon oxide layer resulting in partially defined, initial silicon oxide spacers, and resulting in bottom portions of said silicon oxide layer remaining on said second sections of said STI regions, and remaining on areas of said semiconductor substrate located between said buried stack capacitor structures; and performing a wet etch procedure to remove bottom portions of said silicon oxide layer defining final silicon oxide spacers and resulting in said composite insulator spacers on sides of said buried stack capacitor structures, wherein said composite insulator spacers are comprised of final silicon oxide spacers overlying said silicon nitride spacers, and with said wet etch procedure establishing a smooth topography on said second sections of STI regions, and establishing a gradual slope at the interface of a composite insulator spacer and a second section of said STI region.

2. The method of claim 1, wherein said shallow trench isolation (STI) regions are formed in a shallow trench shape, which in turn are defined to a depth between about 3000 to 4000 Angstroms, in top portions of said semiconductor substrate via an anisotropic RIE procedure using $Cl_2$ or $SF_6$ as an etchant for silicon.

3. The method of claim 1, wherein STI regions are formed via filling of the shallow trench shape with a silicon oxide layer, obtained via LPCVD or PECVD procedures, using tetraethylorthosilicate as a source.

4. The method of claim 1, wherein said recesses in said STI region are formed to a depth between about 1600 to 2000 Angstroms, via said first dry etch procedure using $CHF_3$ as an etchant for silicon oxide.

5. The method of claim 1, wherein said storage node structures are polysilicon storage node structures, formed from a polysilicon layer which in turn is obtained via LPCVD procedures at a thickness between about 250 to 350 Angstroms, with the polysilicon layer then doped P type via implantation of boron ions.

6. The method of claim 1, wherein said storage node structures are defined in said recesses in said STI regions, via removal of unwanted portions of polysilicon via a chemical mechanical polishing procedure, with photoresist plug structures used to protect portions of polysilicon located in said recesses in said STI regions.

7. The method of claim 1, wherein said capacitor dielectric layer is an oxidized silicon nitride (NO) layer, obtained at a thickness between about 50 to 53 Angstroms.

8. The method of claim 1, wherein said capacitor top plate structures are polysilicon top plate structures, formed from a polysilicon layer which in turn is obtained via LPCVD procedures at a thickness between about 450 to 550 Angstroms, with the polysilicon layer then doped P type via implantation of boron ions.

9. The method of claim 1, wherein said silicon nitride spacers are formed from a silicon nitride layer which in turn is obtained via LPCVD or PECVD procedures at a thickness between about 200 to 300 Angstroms.

10. The method of claim 1, wherein said silicon nitride spacers are formed on the sides of said buried stack capacitor structures via an anisotropic RIE procedure performed using $Cl_2$ or $CF_4$ as an etchant for silicon nitride.

11. The method of claim 1, wherein said silicon oxide layer is obtained at a thickness between about 1000 to 1200 Angstroms, using tetraethylorthosilicate (TEOS) as a source.

12. The method of claim 1, wherein said second dry etch procedure, used to define said initial silicon oxide spacers, is performed using $CHF_3$ as an etchant to remove between about 800 to 900 Angstroms of said silicon oxide layer.

13. The method of claim 1, wherein said wet etch procedure, used to remove said bottom portions of said silicon oxide layer defining final silicon oxide spacers, is performed using a buffered hydrofluoric (BHF), or a dilute hydrofluoric (DHF), acid solution.

14. A method of forming buried stack capacitor structures on a semiconductor substrate, featuring a dry-wet etch procedure to define silicon oxide spacer components of composite insulator spacers, located on the sides of said buried stack capacitor structures, comprising the steps of:

forming shallow trench shapes in a composite insulator layer, and in a top portion of said semiconductor substrate;

depositing a first silicon oxide layer completely filling said shallow trench shapes;

removing portions of said first silicon oxide layer from the top surface of said composite insulator layer resulting in silicon oxide filled, shallow trench isolation (STI) regions located in said top portions of said semiconductor substrate;

performing a first anisotropic reactive ion etch (RIE) procedure to form recesses in top portions of first sections of said STI regions, while second sections of said STI regions remain unetched;

depositing a first polysilicon layer;

performing a first ion implantation procedure to place ions into said first polysilicon layer creating a first doped polysilicon layer;

forming photoresist plug structures on portions of said first doped polysilicon layer located in said recesses in said top portions of first sections of said STI region;

removing portions of said first doped polysilicon layer not protected by said photoresist plug structures, resulting in definition of polysilicon storage node structures in said recesses located in said top portions of said first sections of said STI regions;

removing said composite insulator layer from portions of the top surface of said semiconductor substrate not occupied by said STI regions;

forming a capacitor dielectric layer on said polysilicon storage node structures;

depositing a second polysilicon layer;

performing a second ion implantation procedure to place ions into said second polysilicon layer creating a second doped polysilicon layer;

depositing an insulator stop layer on said second doped polysilicon layer;

performing a second anisotropic RIE procedure to create insulator stop shapes, polysilicon top plate structures, and capacitor dielectric shapes, on underlying polysilicon storage node structure, resulting in said buried stack capacitor structures located on said first sections of said STI regions, each comprised with an overlying insulator stop layer shape, a polysilicon top plate structure, a capacitor dielectric layer, and with a polysilicon storage node structure, and with said second sections of said STI regions not covered by said buried stack capacitor structures;

depositing a silicon nitride layer;

performing a third anisotropic RIE procedure forming silicon nitride spacers on the sides of said buried stack capacitor structures;

depositing a second silicon oxide layer;

performing a fourth anisotropic RIE procedure removing a top portion of said second silicon oxide layer resulting in partially defined, initial silicon oxide spacers, and resulting in bottom portions of said second silicon oxide layer remaining on said second sections of said STI regions, and on areas of said semiconductor substrate located between said buried stack capacitor structures; and performing a wet etch procedure to remove bottom portions of said second silicon oxide layer defining final silicon oxide spacers and resulting in said composite insulator spacers on sides of said buried stack capacitor structures, wherein said composite insulator spacers are comprised of final silicon oxide spacers on said silicon nitride spacers, and with said wet etch procedure establishing a smooth topography on said second sections of STI regions, and establishing a gradual slope at the interface of a composite insulator spacer and a second section of said STI region.

15. The method of claim 14, wherein said shallow trench shapes are formed to a depth between about 3000 to 4000 Angstroms in said semiconductor substrate, via an anisotropic RIE procedure, using $Cl_2$ or $SF_6$ as an etchant for silicon.

16. The method of claim 14, wherein said first silicon oxide layer, used to fill said shallow trench shapes, is obtained at a thickness between about 6000 to 8000 Angstroms via LPCVD or PECVD procedures, using tetraethylorthosilicate as a source.

17. The method of claim 14, wherein said first anisotropic RIE procedure, used to form recesses in said STI region, is performed using $CHF_3$ as an etchant for silicon oxide.

18. The method of claim 14, wherein said recesses are formed in said in top portions of first sections of said STI regions, to a depth between about 1600 to 2000 Angstroms.

19. The method of claim 14, wherein said first doped polysilicon layer is obtained via intrinsic deposition of a polysilicon layer via LPCVD procedures to a thickness between about 250 to 350 Angstroms, followed by said first ion implantation procedure, performed using boron ions.

20. The method of claim 14, wherein said polysilicon storage node structures are defined in said recesses in said STI regions by removal of unwanted portions of polysilicon via a chemical mechanical polishing procedure, with said photoresist plug structures protecting portions of said first doped polysilicon layer, located in said recesses in said STI regions.

21. The method of claim 14, wherein said polysilicon storage node structures are defined in said recesses in said STI regions by removal of unwanted portions of polysilicon via a selective RIE procedure, using $Cl_2$ or $SF_6$ as an etchant, with said photoresist plug structures protecting portions of said first doped polysilicon layer, located in said recesses in said STI regions.

22. The method of claim 14, wherein said capacitor dielectric layer is an oxidized silicon nitride (NO) layer, obtained at a thickness between about 50 to 53 Angstroms.

23. The method of claim 14, wherein said second doped polysilicon layer is obtained via intrinsic deposition of a polysilicon layer via LPCVD procedures to a thickness between about 450 to 550 Angstroms, followed by said second ion implantation procedure, performed using boron ions.

24. The method of claim 14, wherein said insulator stop layer is a silicon oxynitride layer, obtained via LPCVD or PECVD procedures, at a thickness between about 250 to 350 Angstroms.

25. The method of claim 14, wherein said second anisotropic RIE procedure used to define said insulator stop layer shapes, used to define said polysilicon capacitor top plate structures, and used to define said capacitor dielectric shapes, is performed using $CHF_3$ as an etchant for said insulator stop layer and for said capacitor dielectric layer, while using $Cl_2$ or $SF_6$ as an etchant for said second doped polysilicon layer.

26. The method of claim 14, wherein said silicon nitride layer is obtained via LPCVD or PECVD procedures at a thickness between about 200 to 300 Angstroms.

27. The method of claim 14, wherein said third anisotropic RIE procedure, used to define said silicon nitride spacers, is performed using $Cl_2$ or $CF_4$ as an etchant for silicon nitride.

28. The method of claim 14, wherein said second silicon oxide layer is obtained at a thickness between about 1000 to 1200 Angstroms, using tetraethylorthosilicate (TEOS) as a source.

29. The method of claim 14, wherein said fourth anisotropic RIE procedure, used to define said initial silicon oxide spacers, is performed using $CHF_3$ as an etchant, removing between about 800 to 900 Angstroms of said second silicon oxide layer.

30. The method of claim 14, wherein said wet etch procedure, used to remove said bottom portions of said second silicon oxide layer, and used to define final silicon oxide spacers, is performed using a buffered hydrofluoric (BHF), or a dilute hydrofluoric (DHF), acid solution.

* * * * *